(12) United States Patent
Bell et al.

(10) Patent No.: US 6,683,449 B1
(45) Date of Patent: Jan. 27, 2004

(54) APPARATUS AND METHOD FOR DETECTING A MECHANICAL COMPONENT ON A COMPUTER SYSTEM SUBSTRATE

(75) Inventors: James Stephen Bell, Austin, TX (US); Matthew Bruce Mendelow, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 136 days.

(21) Appl. No.: 09/684,021

(22) Filed: Oct. 6, 2000

(51) Int. Cl.[7] .......................... H05K 7/20; H01L 23/34; G01N 27/00
(52) U.S. Cl. ................... 324/158.1; 324/71.1; 257/718; 361/718
(58) Field of Search ................... 324/71.1, 755, 324/687, 149, 754, 158.1; 361/220, 720, 704, 718, 719, 818; 174/252; 257/718, 719

(56) References Cited

U.S. PATENT DOCUMENTS

| | | | |
|---|---|---|---|
| 4,463,310 A | | 7/1984 | Whitley et al. |
| 4,841,240 A | * | 6/1989 | Hsue et al. .................. 324/754 |
| 4,868,507 A | * | 9/1989 | Reed .......................... 324/541 |
| 5,307,236 A | * | 4/1994 | Rio et al. .................... 361/720 |
| 5,625,297 A | * | 4/1997 | Arnaudov et al. .......... 324/754 |
| 5,696,451 A | * | 12/1997 | Keirn et al. ................ 324/687 |
| 5,734,556 A | * | 3/1998 | Saneinejad et al. ......... 361/719 |
| 5,877,033 A | | 3/1999 | Matern |
| 6,051,979 A | | 4/2000 | Chandler et al. |
| 6,137,280 A | * | 10/2000 | Ackermann et al. ........ 324/426 |
| 6,188,577 B1 | * | 2/2001 | Liu ............................. 361/704 |

OTHER PUBLICATIONS

US 4,973,852, 11/1990, Denkevitz (withdrawn)

* cited by examiner

*Primary Examiner*—Kamand Cuneo
*Assistant Examiner*—Paresh Patel
(74) *Attorney, Agent, or Firm*—Russell D. Culbertson; Shaffer & Culbertson, L.L.P.

(57) ABSTRACT

An electrically conductive strap is connected to an electrically conductive first connector at one end and connected to an electrically conductive second connector at the other end. Both connectors are mounted on the substrate so that the connected strap extends over a portion of the mechanical component, or otherwise cooperates with the mechanical component, to secure the mechanical component in the desired position. Also, the connection between the strap and the first connector electrically couples the strap to the first connector while the connection between the strap and the second connector electrically couples the strap to the second connector. At least one of the connectors, the first connector for example, is also electrically coupled to a first reference voltage preferably available on the substrate. The electrical condition of the second connector may then be used to indicate whether the strap and therefore the mechanical component is in place on the substrate.

21 Claims, 3 Drawing Sheets

APPARATUS AND METHOD FOR DETECTING A MECHANICAL COMPONENT ON A COMPUTER SYSTEM SUBSTRATE

TECHNICAL FIELD OF THE INVENTION

This invention relates to testing and diagnostic systems of particular use in electronic devices such as computers. More specifically, the invention relates to an apparatus, method, and computer program product for detecting the presence of a mechanical component on a circuit board.

BACKGROUND OF THE INVENTION

In addition to the electronic components in an electronic system such as a computer, the system may include a number of important non-electronic components. These non-electronic components are those having some function in the electronic system that does not necessarily depend upon receiving or sending an electrical signal, and will be referred to in this disclosure and the accompanying claims as "mechanical components."

A heat sink is an example of a mechanical component commonly included in an electronic system. Heat sinks are devices used to help draw heat away from electronic components such as processors and transformers. The cooling provided by a heat sink is commonly critical to the proper operation of the electronic component with which the heat sink is associated. In fact, certain electronic components will overheat and become irreparably damaged if they are operated without a heat sink for a significant period of time.

Electronic systems may undergo various tests as part of the assembly and production process to determine the presence and proper operation of the various system components. Numerous electronic testing techniques have been developed for detecting and testing the operation of electronic components in an electronic system. However, testing for mechanical components requires different techniques.

One type of test arrangement which may be used for mechanical components includes an array of probes and switches. In this type of testing apparatus, the probe array is brought into contact with a surface of an electronic system such as a printed circuit board assembly while the system is held in a test fixture. When one of the probes reaches a location occupied by a mechanical component in the printed circuit board assembly, the contact between the component and the probe displaces the probe and this displacement is used to change the condition of a switch associated with the probe. The change in condition of the switch indicates that the mechanical component is present on the circuit board. However, if a probe which is aligned at a location of the board which is supposed to contain a mechanical component is not displaced as the probe array is brought into contact with the board assembly, the associated switch will not be tripped. This indicates that the mechanical component is not present at the desired position on the board.

Another type of test arrangement used in printed circuit board assembly testing includes one or more emitter/detector pairs. In emitter/detector type test equipment, an emitter emits a probe beam across an area of a printed circuit board assembly toward a detector adapted to detect the probe beam. If the probe beam is directed across an area in which a mechanical component is expected to be located, the detector should not detect the probe beam since it should be blocked by the mechanical component. If the probe beam is directed across an area that should contain a mechanical component but is detected by the detector, the presence of the probe beam at the detector indicates that the mechanical component is not present.

All of these prior test arrangements for mechanical components of an electronic system require special test fixtures adapted for the particular system under test. Also, testing may generally be done only at system assembly. Thus, the prior testing arrangements provide no method of detecting the presence of mechanical components once the assembly is put in service. However, a mechanical component such as a heat sink may be removed during system service or maintenance and may be inadvertently left off when the system is returned to service. With no way to test for the presence of the heat sink, the system may be allowed to operate without the heat sink for a period of time sufficient to damage the electronic component that the heat sink protected.

There is therefore a need for an improved testing arrangement for detecting the presence of mechanical components included in an electronic system. The improved testing arrangement should be useful not only during production testing but also after the electronic system is placed in service.

SUMMARY OF THE INVENTION

It is an object of the invention to provide an apparatus and method for facilitating the detection of a mechanical component on a substrate, particularly, a substrate such as a printed circuit board assembly of an electronic system. It is also an object of the invention to provide a computer program product for use in detecting the presence or absence of a mechanical component in an electronic system.

The apparatus according to the invention includes an electrically conductive strap which is used to secure a mechanical component in a desired position on a substrate. The strap is connected to an electrically conductive first connector at one end and connected to an electrically conductive second connector at the other end. Both connectors are mounted on the substrate so that the connected strap cooperates with the mechanical component to secure the mechanical component in the desired position. Also, the connection between the strap and the first connector electrically couples the strap to the first connector while the connection between the strap and the second connector electrically couples the strap to the second connector. At least one of the connectors, the first connector for example, is also electrically coupled to a first reference voltage preferably available on the substrate.

With this conductive strap and connector arrangement for securing the mechanical object on the substrate, the electrical condition of the second connector may be used to indicate whether the strap and therefore the mechanical component is in place on the substrate. That is, detecting the first reference voltage at the second connector indicates that the strap is properly connected between the first and second connectors and that the mechanical component is secured in place by the strap. However, detecting that the second connector is not electrically coupled to the first reference voltage indicates that the strap and mechanical component are both missing or are not properly installed.

The method according to the invention includes first coupling the first connector to the first reference voltage. The method then includes detecting the electrical condition of the second connector to determine if the second connector is electrically coupled to the first reference voltage (that is, to determine if the electrical condition at the second connector is affected by the first reference voltage). In a preferred arrangement, the first reference voltage comprises ground and the step of detecting the electrical condition of the second connector includes attempting to detect ground through the second connector.

Another important arrangement within the scope of the invention utilizes the logical state of a digital signal at the second connector to indicate the presence or absence of the strap and mechanical component. In this preferred form of the invention, the first connector is electrically coupled to ground while the second connector is coupled through a current limiting resistor to a supply voltage available on the substrate. In this arrangement, the second connector remains coupled to ground to produce a "low" or "0" logical state at the second connector when the strap is in place securing the mechanical component in the desired position. Thus, detecting a logical "0" at the second connector indicates the presence of the strap and the mechanical component. However, if the strap is removed so that it no longer holds the mechanical component in the desired position, the second connector is then no longer coupled to ground and is pulled up to the supply voltage level through the current limiting resistor to produce a logical "high" or "1" at the second connector. Detecting a logical "1" at the second connector thus indicates that the strap and mechanical component are absent.

The method of detecting the presence of a mechanical component on a substrate according to the invention may be performed as part of the initial product testing and may also be performed after the system is placed in service. Furthermore, one preferred form of the invention tests for the presence of the mechanical component as part of the system startup or boot sequence. In this form of the invention, a logic device is coupled to read the signal state at the second connector. During system startup, status inquiry program code causes the logic device to read the logical state at the second connector. If the logic device reads a logical "0" then the strap and mechanical component are considered in place and operational control program code causes the system to assume a normal operational state. However, if the logic device reads a logical "1" at the second connector, then the strap and mechanical component are considered not present. In this case the operational control program code causes the system or a portion of the system to go into a safe operation mode to ensure no damage occurs to electronic components due to the absence of the mechanical component. Also, the operational control code may produce an error message indicating that the mechanical component may not be present in the system.

The apparatus and method according to the invention simply and reliably detects the presence or absence of mechanical components on a substrate such as a printed circuit board assembly. Also, the invention facilitates not only production testing but also facilitates testing for the presence or absence of mechanical components after the system has been placed in service.

These and other objects, advantages, and features of the invention will be apparent from the following description of the preferred embodiments, considered along with the accompanying drawings.

DESCRIPTION OF THE PREFERRED EMBODIMENTS

Figure 1:
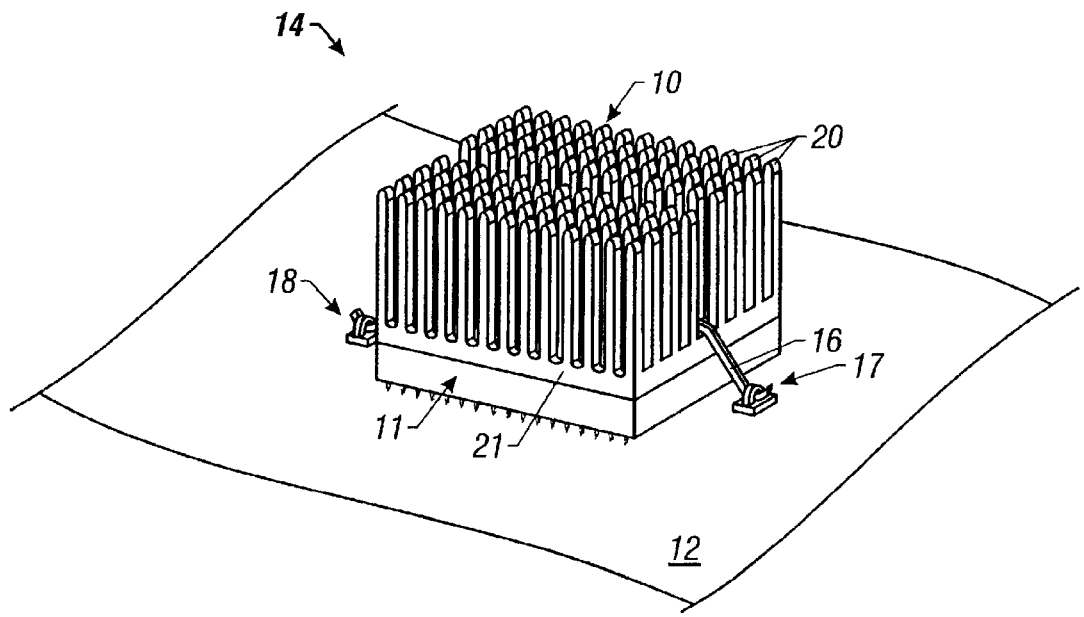
FIG. 1 is an isometric view of a portion of a printed circuit board assembly having a heat sink secured to the assembly according to one preferred embodiment of the invention.
Figure 2:
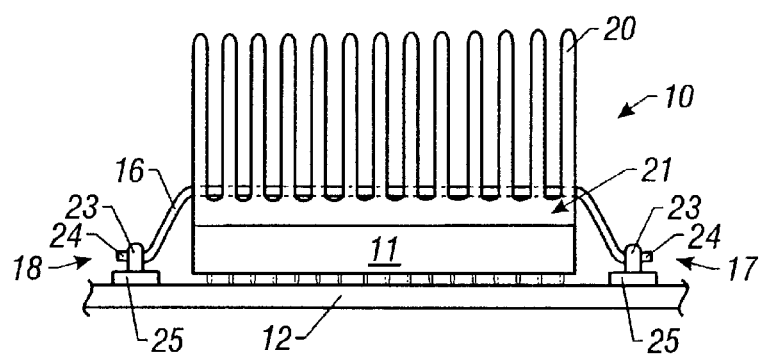
FIG. 2 is a side view of the portion of the printed circuit board assembly shown in FIG. 1.

FIGS. 1 and 2 show an apparatus embodying the principles of invention securing a heat sink 10 on an integrated circuit chip 11 which is mounted on a circuit board 12. The illustrated heat sink 10, chip 11, and circuit board 12 are part of a complete printed circuit board assembly which includes many other interconnected electronic components. However, the remainder of the printed circuit board assembly is omitted from FIGS. 1 and 2 so as not to obscure the invention in unnecessary detail.

As shown in FIGS. 1 and 2, the apparatus according to the invention includes an electrically conductive strap 16. Strap 16 is connected and electrically coupled at one end to a first connector 17 mounted on circuit board 12. The opposite end of strap 16 is connected and electrically coupled to a second connector 18 which is also mounted on circuit board 12. The illustrated strap 16 extends between the fins 20 of heat sink 10 to make, contact with a base portion 21 of the heat sink. When connected in the position shown in FIGS. 1 and 2, strap 16 presses the base portion 21 of the heat sink 10 against the surface of the integrated circuit chip 11 to secure the heat sink on circuit board 12 and maintain good heat conductive contact between the chip and heat sink.

The first and second connectors 17 and 18, respectively, include a portion which is electrically conductive. For example, each connector 17 and 18 may include an electrically conductive loop 23 adapted to cooperate with a hook portion 24 of strap 16 to secure the strap in position. It will be understood that the connectors 17 and 18 need not be made entirely of electrically conductive material and that a portion may be a plastic or some other suitable dielectric material. For example, each connector 17 and 18 may include a plastic base component 25 by which the respective connector is secured to circuit board 12. Any suitable structure may be used for the connectors 17 and 18 as long as the structure provides good electrical contact with strap 16 when the strap is connected, and as long as the structure also facilitates the additional electrical connections described below with reference to FIGS. 3 and 4. Connectors 17 and 18 must also cooperate with strap 16 such that electrical contact between the connectors and the strap occurs only when the strap properly secures the heat sink 10 in the desired position. This may be accomplished in the illustrated form of the invention by forming strap 16 so that contact with heat sink 10 is required to pull hook portions 24 of the strap into good electrical contact with connectors 17 and 18. Thus, if it is attempted to connect strap 16 without heat sink 10 in place, hook portions 24 of the strap would at best be loose in connectors 17 and 18, and there would be no consistent electrical contact between the strap and the connectors.

Although the conductive strap and connector arrangement according to the invention is shown in FIGS. 1 and 2 in connection with heat sink 10, the strap and connector arrangement may be used to secure any other type of mechanical component to a printed circuit board assembly or other substrate. That is, the present invention is not limited to the illustrated heat sink application. Also, numerous structural differences for the strap 16 and connectors 17 and 18 are possible within the scope of the invention and the accompanying claims. For example, the strap need not fit over the mechanical component as shown in FIGS. 1 and 2. Rather, the strap may cooperate with the mechanical component in any suitable fashion to secure the component in the desired position. Furthermore, although strap 16 is shown in the figures as being separate from the mechanical component which it secures (heat sink 10), a strap according to the invention may be incorporated with the mechanical component or integrally formed with the mechanical component.

Figure 3:
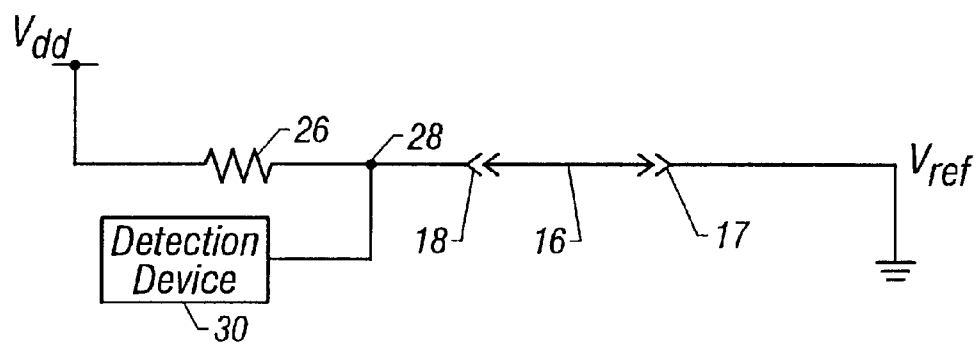
FIG. 3 is an electrical schematic illustrating a preferred form of the invention with the strap properly connected in position to secure the heat sink shown in FIG. 1.
Figure 4:
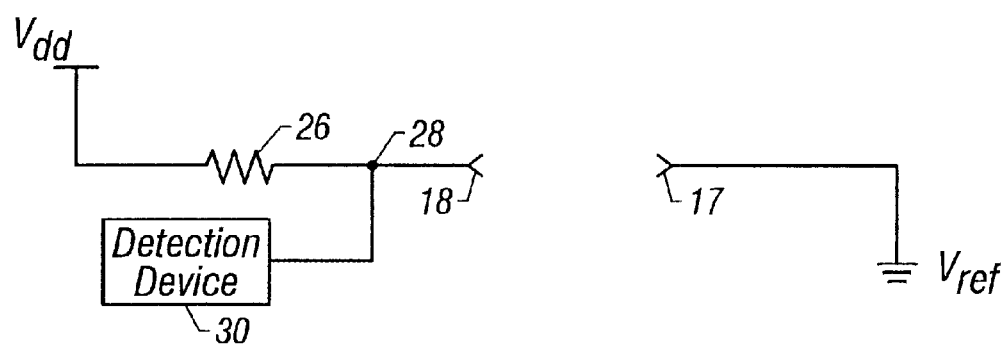
FIG. 4 is an electrical schematic similar to FIG. 3 but with the strap removed so that it does not secure the heat sink shown in FIG. 1.

FIG. 3 illustrates the electrical connections of the strap 16 shown in FIGS. 1 and 2 in one preferred arrangement according to the invention. One connector, in this case first connector 17, is electrically coupled to a first reference voltage. In this case the first reference voltage is ground and may be the ground plane associated with circuit board 12. The other connector, in this case second connector 18, is electrically coupled to a supply voltage $V_{dd}$ through a current limiting resistor 26. This supply voltage $V_{dd}$ may be the supply voltage available on circuit board 12 for use by integrated circuit chip 11 and the other electronic components (not shown) mounted on the board. FIG. 3 also shows a detection device 30 which is electrically coupled to a test node 28 between the second connector 18 and resistor 26. In FIG. 3, strap 16 is shown connected to the two connectors 17 and 18 to provide electrical continuity between the connectors. FIG. 4, however, illustrates the situation in which conductive strap 16 is removed from connectors 17 and 18. When removed as shown in FIG. 4, the strap 16 is not available to provide electrical continuity between connectors 17 and 18.

The invention utilizes the presence or absence of conductive strap 16 to indicate the presence or absence of the mechanical component which the strap secures. When strap 16 is connected between connectors 17 and 18 as shown in FIGS. 1 through 3, it is assumed that the strap is also functioning to secure the mechanical component. However, when strap 16 is not connected between connectors 17 and 18 as illustrated in FIG. 4, it is assumed that the mechanical component is also not present.

It will be noted by comparing FIGS. 3 and 4 that the presence of the conductive strap 16 affects the electrical condition at connector 18 and test node 28. That is, when strap 16 is in place as shown in FIG. 3, connector 18 and thus test node 28 remains coupled to the first reference voltage, ground in this case. Therefore, detecting the first reference voltage at test node 28 indicates that the strap is in place and thus the mechanical component is in place. The failure to detect the first reference voltage at test node 28 indicates that strap 16 is not present as shown in FIG. 4, and that the mechanical component 10 is also not present.

FIGS. 3 and 4 show a detection device 30 for detecting the electrical condition at second connector 18 and test node 28. In the illustrated arrangement in which first connector 17 is connected to ground and second connector 18 is connected to the supply voltage, test node 28 and connector 18 reside at ground as long as strap 16 is in place as shown in FIG. 3. Current will continually flow through the test node, but will be limited by current limiting resistor 26. However, removing strap 16 as shown in FIG. 4 removes the ground connection for second connector 18 and test node 28 so that the voltage at the second connector and test node quickly rises to the supply voltage level. Thus, in the circuit arrangement shown in FIGS. 3 and 4, second connector 18 and test node 28 essentially reside exclusively at either ground or at the supply voltage level. In this arrangement detection device 30 may comprise a logic device adapted to detect the supply voltage level as one logical state and ground as the opposite logical state. For example, the supply voltage level may represent a logical "1" while ground may represent a logical "0."

Figure 5:
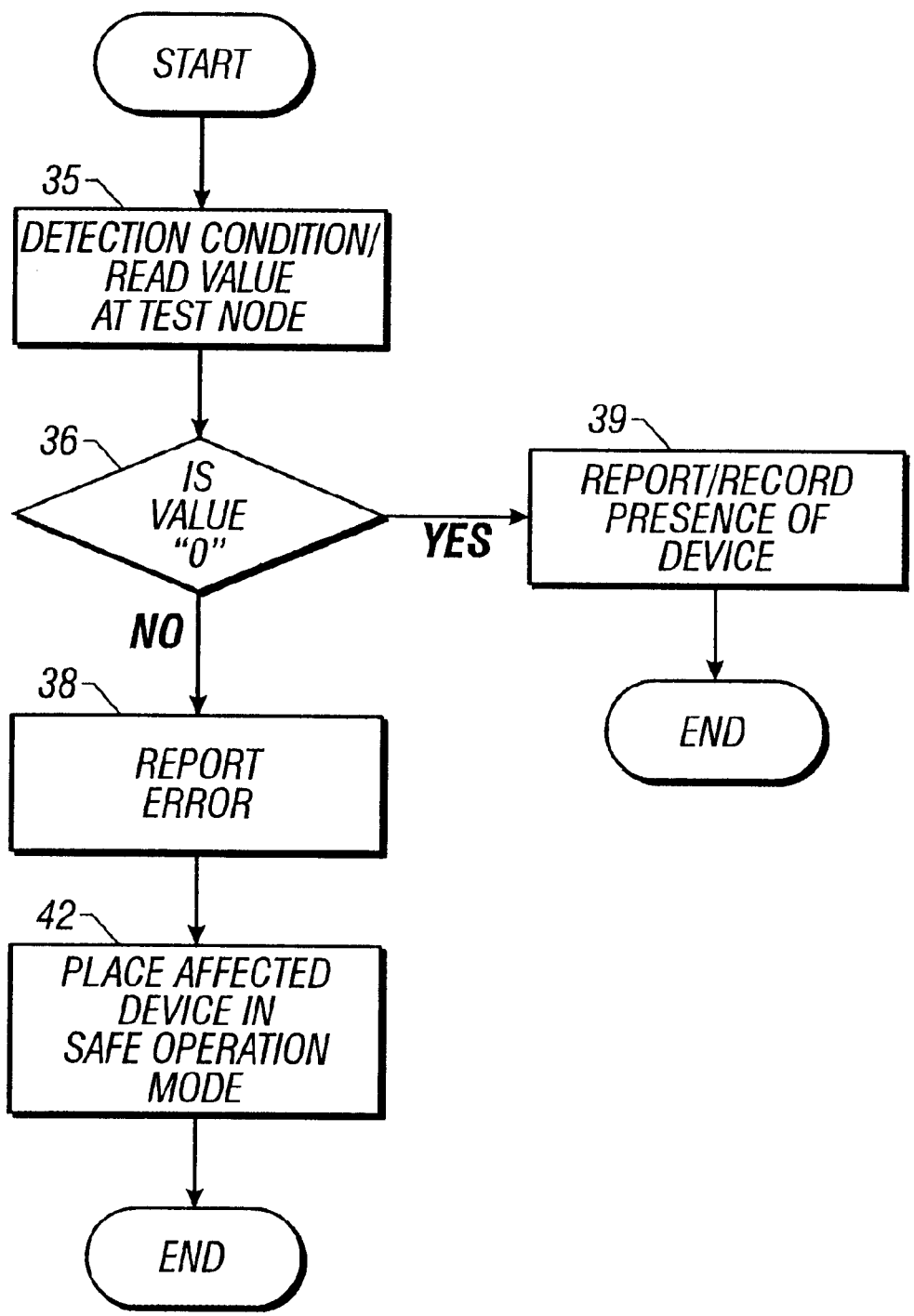
FIG. 5 is a flow chart illustrating the method performed according to the invention.

The operation of the apparatus shown in FIGS. 1 through 4 and the method of the invention may be described with reference particularly to FIGS. 3 and 4 and to the flow chart shown in FIG. 5. The method includes a first coupling the first connector 17 to the reference voltage. This step preferably comprises coupling the first connector to ground as shown in FIGS. 3 and 4. With the first connector 17 coupled to the first reference voltage, the method includes the step of detecting the electrical condition at the second connector 18 as illustrated at step 35 in FIG. 5. When the electrical condition at test node 28 and second connector 18 is unaffected by the first reference voltage, strap 16 must be disconnected as shown in FIG. 4. Since strap 16 secures the mechanical component in position, it can be assumed that when strap 16 is not present the mechanical component is also not present. However, detecting that the electrical condition at test node 28 and second connector 18 is affected by the first reference voltage indicates that strap 16 is in place as shown in FIG. 3 providing electrical continuity between the test node 28 and the first reference voltage. It is assumed that if strap 16 is in place, the mechanical component is in place as well.

In the preferred form of the invention shown in FIGS. 3 and 4, the step of detecting the electrical condition at second connector 18 may be performed using a control logic device as the detecting device 30. The control logic device may be a device such as a processor having a general purpose input/output pin connected to test node 28. If strap 16 is in place as shown in FIG. 3, test node 28 and second connector 18 will remain at ground and therefore appear to the control logic device as a logical "0." However, if strap 16 is removed as shown in FIG. 4, test node 28 and second connector 18 will be pulled up to the supply voltage level $V_{dd}$. Thus, the control logic device will read the test node 28 as a logical "1."

Testing for the presence of the mechanical component according to the invention may be performed manually or preferably under software control. The software may be executed by any suitable processing device. For example, detection device 30 may comprise a processor capable of executing software to perform the detection step described above and then take appropriate action in response to the result of the detection step.

The preferred testing software according to the invention includes status inquiry program code and operational control program code. The status inquiry program code performs the detection step shown at step 35 in FIG. 5 and also performs the branching decision step shown at decision box 36. After branching at step 36, the operation control program code causes the processor to take action appropriate to the result of the detection step. Referring still to FIG. 5, the appropriate action may comprise an error sequence which includes the step of producing an error message as shown at step 38 if the condition at test node 28 indicates that the strap and mechanical component are absent. Alternatively, if the condition at test node 28 indicates that the strap 16 and mechanical component 10 are in place, the appropriate action may be reporting proper operation as shown at step 39 and/or ending the test sequence.

Perhaps the most important action that the operational control program code may make in response to an indication that the strap and mechanical component are missing may be an action which ensures the system is not damaged by operating without the mechanical component. This is particularly the case where the mechanical component being detected is a heat sink which protects a critical electrical component of a system. Thus, the operational control program code may include program code for placing the system, or a portion of the system affected by the absence of the mechanical component, in a safe operating mode as shown at step 42 in FIG. 5. The step of placing the system or affected component in this safe operation mode is included in the error sequence when the detection step 35 indicates that the strap 16 and mechanical component are absent. It will be noted that the component placed in a safe operation mode by the operation control program code may be the processor which executes the status inquiry and operational control program code according to the invention.

The status inquiry and operational control program code described above may be included in testing software executed by a separate testing apparatus as part of production testing for a given electronic system. However, one important advantage of the present invention is that the status inquiry and operational control program code may be executed by the system under test itself as part of a self test. In one form of the invention, the program code according to the invention is executed as part of a startup sequence performed by an electronic system. For example, the status inquiry and operational control program code may be included in the basic input output system (BIOS) program executed by a computer each time the computer is started or reset. Including the program code according to the invention in the system BIOS ensures that the presence of critical mechanical components is checked each time the system is operated.

It will be appreciated that the electrical arrangement shown in FIGS. 3 and 4 is particularly useful for use in connection with automated testing or self testing for mechanical components under software control as described above. However, the invention is not limited to automated or self testing and is not limited to the electrical arrangement shown in FIGS. 3 and 4. For example, second connector 18 and test node 28 need not be coupled to any reference voltage such as the system supply voltage. Rather, a detection device such as device 30 may simply make electrical contact with test node 28 to detect the first reference voltage which may be ground or some other voltage level. The detection device may include a probe which is manually positioned to contact test node 28 or which is positioned by an automated testing device. Also, although the form of the invention shown in FIGS. 3 and 4 uses voltage levels at test node 28 and second connector 18 to indicate the presence or absence of strap 16 and mechanical component 10, other electrical characteristics at the test node may be used in the alternative. For example, the electrical condition detected at test node 28 and second connector 18 may be current rather than voltage.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. An apparatus for facilitating the detection of a mechanical component on a substrate, the apparatus including:
    (a) a first electrically conductive connector mounted on the substrate, the first connector being electrically coupled to a first reference voltage available on the substrate;
    (b) a second electrically conductive connector mounted on the substrate, the second connector being electrically coupled to a second reference voltage available on the substrate, the second reference voltage being different from the first reference voltage;
    (c) an electrically conductive strap connected and electrically coupled at one end to the first connector and connected and electrically coupled at an opposite end to the second connector, the electrically conductive strap connected to the first and second connectors being in position to secure the mechanical component on the substrate; and
    (d) a detection device electrically coupled to the second connector for detecting the electrical condition of the second connector.

2. The apparatus of claim 1 wherein the first reference voltage is ground.

3. The apparatus of claim 2 wherein the second connector is electrically coupled to the second reference voltage through a current limiting resistance.

4. The apparatus of claim 3 wherein the detection devices includes:
    (a) a control logic device electrically coupled to the second connector for detecting the logical voltage state at the second connector.

5. The apparatus of claim 4 wherein the control logic device comprises a processor.

6. The apparatus of claim 4 wherein the control logic device is mounted on the substrate.

7. The apparatus of claim 1 wherein the mechanical component comprises a heat sink and the strap secures the heat sink in an operating position on an integrated circuit chip mounted on the substrate.

8. A computer system including:
    (a) a printed circuit board assembly;
    (b) a first electrically conductive connector mounted on the printed circuit board assembly, the first connector being electrically coupled to a ground voltage available on the printed circuit board assembly;
    (c) a second electrically conductive connector mounted on the printed circuit board assembly and coupled through a current limiting resistance to a supply voltage available on the substrate;
    (d) an electrically conductive strap connected and electrically coupled at one end to the first connector and connected and electrically coupled at an opposite end to the second connector, the electrically conductive strap securing an object on the printed circuit board assembly; and
    (e) a control logic device electrically coupled to the second connector for detecting the logical voltage state at the second connector.

9. The computer system of claim 8, wherein the control logic device comprises a processor.

10. The computer system of claim 9 wherein the control logic device is mounted on the printed circuit board assembly.

11. The computer system of claim 8 wherein the object comprises a heat sink and the strap secures the heat sink in an operating position on an integrated circuit chip mounted on the printed circuit board assembly.

12. A method for detecting the presence of an object mounted in an operating position directly or indirectly on a substrate, the method including the steps of:
    (a) connecting and electrically coupling an electrically conductive strap to a first connector supported on the substrate;

(b) connecting and electrically coupling the electrically conductive strap to a second connector supported on the substrate with the strap positioned over a portion of the object in the operating position;

(c) electrically coupling the first connector to a first reference voltage; and (d) monitoring the voltage state of the second connector.

13. The method of claim 12 wherein the first reference voltage comprises ground and further including the step of:

(a) electrically coupling the second connector to a second reference voltage through a current limiting resistor, the second reference voltage having a value different from ground.

14. The method of claim 13 wherein the step of monitoring the voltage state of the second connector includes the step of:

(a) determining whether the second connector is at the second reference voltage or at ground.

15. The method of claim 14 wherein the step of monitoring the voltage state of the second connector is performed in a system startup sequence for an electronic system which includes the substrate.

16. The method of claim 12 further including the step of:

(a) placing an electronic system which includes the substrate in a safe operation mode in the event that the voltage state of the second connector indicates that the second connector is not electrically coupled to the first reference voltage.

17. The method of claim 12 further including the step of:

(a) producing an error indication if the voltage state of the second connector indicates that the second connector is not electrically coupled to the first reference voltage.

18. An apparatus for facilitating the detection of a mechanical component in an operating position on a substrate, the apparatus including:

(a) a first electrically conductive connector supported on the substrate, the first connector being electrically coupled to a first reference voltage available through the substrate;

(b) a second electrically conductive connector supported on the substrate, the second connector being electrically coupled to a second reference voltage available through the substrate, the second reference voltage being different form the first reference voltage;

(c) an electrically conductive element connected in a monitoring position in which it is connected and electrically coupled at one point to the first connector and connected and electrically coupled at another point to the second connector, the electrically conductive element in the monitoring position contacting the mechanical component in the operating position so that such contact retains the electrically conductive strap in the monitoring position; and (d) a detection device electrically coupled to the second connector for detecting the electrical condition of the second connector.

19. The apparatus of claim 18 wherein the first reference voltage is ground.

20. The apparatus of claim 19 wherein the second connector is electrically coupled to the second reference voltage through a current limiting resistance.

21. The apparatus of claim 20 wherein the detection device includes a control logic device electrically coupled to the second connector for detecting a logical voltage state at the second connector.

* * * * *